United States Patent
Tewinkle et al.

(10) Patent No.: US 7,649,392 B2
(45) Date of Patent: Jan. 19, 2010

(54) SYSTEM FOR CONTROLLING A SIGNAL SLEW RATE IN A DIGITAL DEVICE

(75) Inventors: Scott L Tewinkle, Ontario, NY (US); Paul A Hosier, Rochester, NY (US)

(73) Assignee: Xerox Corporation, Norwalk, CT (US)

(*) Notice: Subject to any disclaimer, the term of this patent is extended or adjusted under 35 U.S.C. 154(b) by 70 days.

(21) Appl. No.: 12/034,121

(22) Filed: Feb. 20, 2008

(65) Prior Publication Data
US 2009/0206899 A1 Aug. 20, 2009

(51) Int. Cl.
*H03K 5/12* (2006.01)
(52) U.S. Cl. .................................. 327/170; 327/172
(58) Field of Classification Search ........... 327/170, 327/172
See application file for complete search history.

(56) References Cited

U.S. PATENT DOCUMENTS

| | | | |
|---|---|---|---|
| 4,475,086 A * | 10/1984 | Allen | 327/38 |
| 5,850,772 A * | 12/1998 | Hayashi | 83/37 |
| 2004/0239391 A1* | 12/2004 | Culler | 327/170 |
| 2005/0184778 A1* | 8/2005 | Figoli | 327/172 |
| 2006/0244651 A1 | 11/2006 | Hosier | |

* cited by examiner

Primary Examiner—Lincoln Donovan
Assistant Examiner—Ryan C Jager
(74) Attorney, Agent, or Firm—Simpson & Simpson, PLLC

(57) ABSTRACT

A system for controlling a slew rate of a signal, such as used in an imaging device, comprises a counter for measuring a duration that the signal drops from a maximum voltage to a predetermined reference voltage; a register for retaining a desired duration that the signal drops from the maximum voltage to the predetermined reference voltage; and a comparator for comparing the measured duration to the desired duration, the comparator being operative of a current source for the signal. An anti-oscillation circuit prevents the system from oscillating between two discrete durations.

10 Claims, 3 Drawing Sheets

US 7,649,392 B2

SYSTEM FOR CONTROLLING A SIGNAL SLEW RATE IN A DIGITAL DEVICE

INCORPORATION BY REFERENCE

The following US Published Patent Application is incorporated by reference in its entirety for the teachings therein: 2006/0244651 A1.

TECHNICAL FIELD

The present disclosure relates to a system for controlling an internal signal as would be used in an "imaging chip," for example, a photosensor chip, LED chip used in xerography, or ink-jet printhead.

BACKGROUND

US Published Patent Application 2006/0244651 A1, along with other patents referenced therein, gives a basic overview of an imaging chip in which signals from each of a large number of photosensors are read out over time. Other types of "imaging chip" for present purposes include LED chips used in xerography, or ink-jet printheads. In all of these cases, image-related data is loaded either on or off the chip according to a predetermined time-based scheme.

In such readout or read-in schemes used in imaging chips, various internal signals are used for various purposes. An internal signal rises above a predetermined amplitude (typically, but not necessarily, voltage) for a predetermined time duration. The internal signal can be generated on the chip or introduced onto the chip from a larger control system, and can be derived or otherwise controlled by another "master clock" signal originating on or off the chip.

In some situations it is desirable that each pulse of an internal signal on the chip have a predetermined "slew rate," that is, a consistent decrease from a maximum amplitude to predetermined cutoff point. In practical implementations, however, the slew rate may vary from pulse to pulse over time according to conditions, such as caused by parasitic capacitance and other factors. Variations of slew rate over time and from chip to chip can significantly degrade on-chip noise and, in the case of a photosensor chip, image signal quality. The present disclosure relates to a system that can improve the performance of an internal signal.

SUMMARY

According to one aspect, there is provided an apparatus for controlling a slew rate of a signal, comprising a counter for measuring a duration that the signal drops from a maximum voltage to a predetermined reference voltage; a register for retaining a desired duration that the signal drops from the maximum voltage to the predetermined reference voltage; and a comparator for comparing the measured duration to the desired duration, the comparator being operative of a current source for the signal.

DETAILED DESCRIPTION

Figure 1:
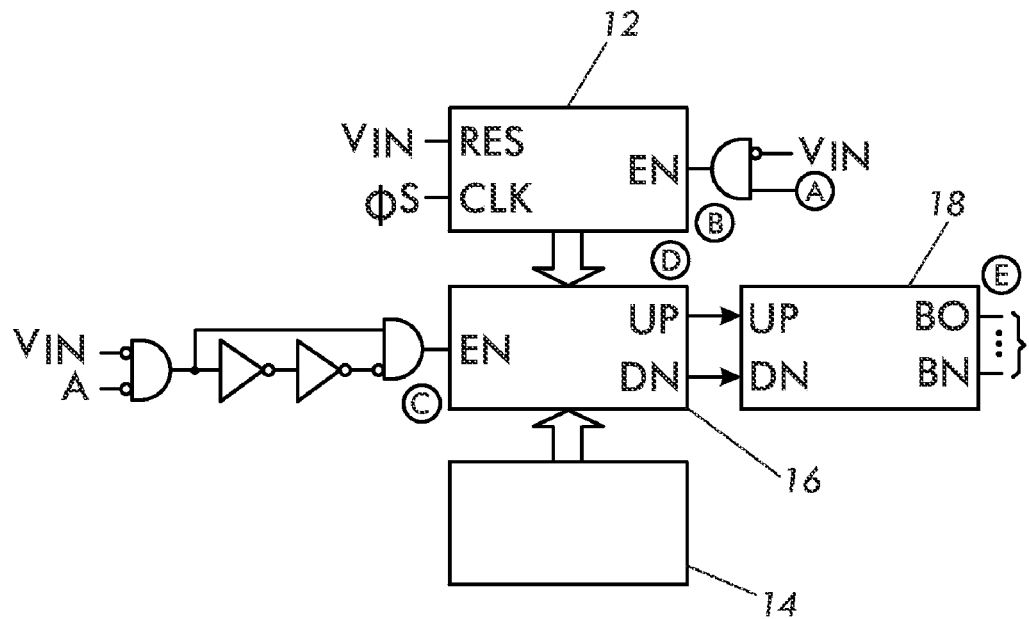
FIG. 1 is a basic systems diagram of a first portion of a driver.
Figure 2:
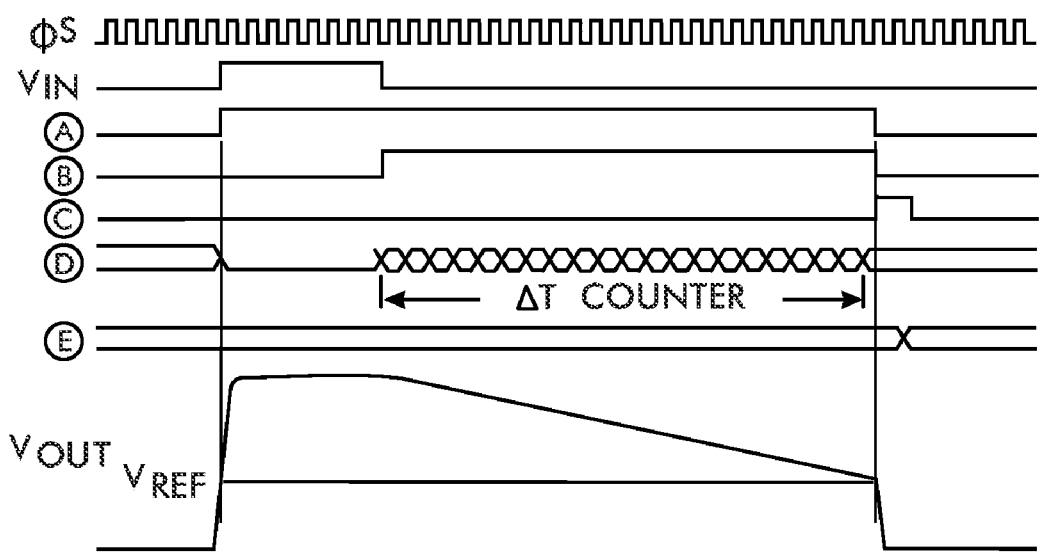
FIG. 2 is a comparative timing diagram showing the operation of the driver at various locations thereof, as labeled in FIG. 1.

FIG. 1 is a basic systems diagram of a first portion of a driver, while FIG. 2 is a comparative timing diagram showing the operation of the driver at various locations thereof, as labeled A, B, C, D, E in each Figure. The behavior of $V_{IN}$, $V_{REF}$, and $V_{OUT}$ shown in FIG. 1B demonstrates the overall function of the driver. In some practical applications or in cases of limited power drive it may be desirable to have a internal signal look more like $V_{OUT}$ with either a slow slewing rise, or slow falling slew as shown in FIG. 2. The shape difference or "slew" between $V_{IN}$ and $V_{OUT}$ is a result of, among other things, parasitic capacitances within a larger system, and variations in behavior of an on-chip current source. In a CMOS chip such as a photosensor chip, the value of applied current may vary by 50%, while the load capacitance C of $V_{OUT}$ may vary by 25%, due to the expected process variations of the CMOS process. These variations directly affect the slew rate $\Delta T$ of the system, as $\Delta T = (C/I)\Delta V$.

In overview, the driver addresses the variable-slew-rate problem by providing a self-controlling, variable current source for the driver. The "input" for the control system is a programmed desired slew rate, the measured actual duration of $V_{OUT}$ slew where it is in excess of a predetermined reference value $V_{REF}$. With reference to FIG. 1, there is provided a counter 12, a register 14, and a comparator 16. One input to the system is a relatively high-frequency fence clock $\phi S$, which is typically available in a scanning system. As shown in FIG. 2, counter 12 measures a slew time, in fence clock $\phi S$ counts, between the beginning of a decrease in the value of $V_{OUT}$ and a final drop (or rise for the rising case not shown) of $V_{OUT}$ below a predetermined reference voltage $V_{REF}$, where $V_{REF}$ can be any value between the starting value and the final value, including the final value. This count is output by counter 12 and compared by comparator 16 against a predetermined reference number of counts that is stored in registers 14: the fence clock count stored in 14 relates to a desired value of $\Delta T$. The outputs of comparator 16 are directed to a binary up/down counter 18, which in turn outputs a parallel control $B_0 \ldots B_N$ to a binary-weighted current source 30, which will be described in detail below with reference to FIG. 3.

In the illustrated embodiment, $\phi S$ is the unit of measure for desired pulse width high time and slew rate duration. $V_{IN}$ high time defines the constant high time of the $V_{OUT}$ pulse, a certain high time being desired for a given circuit and situation, and the count of $\phi S$ determines the slew rate duration, a certain slew rate being desired for a given circuit and situation.

Figure 3:
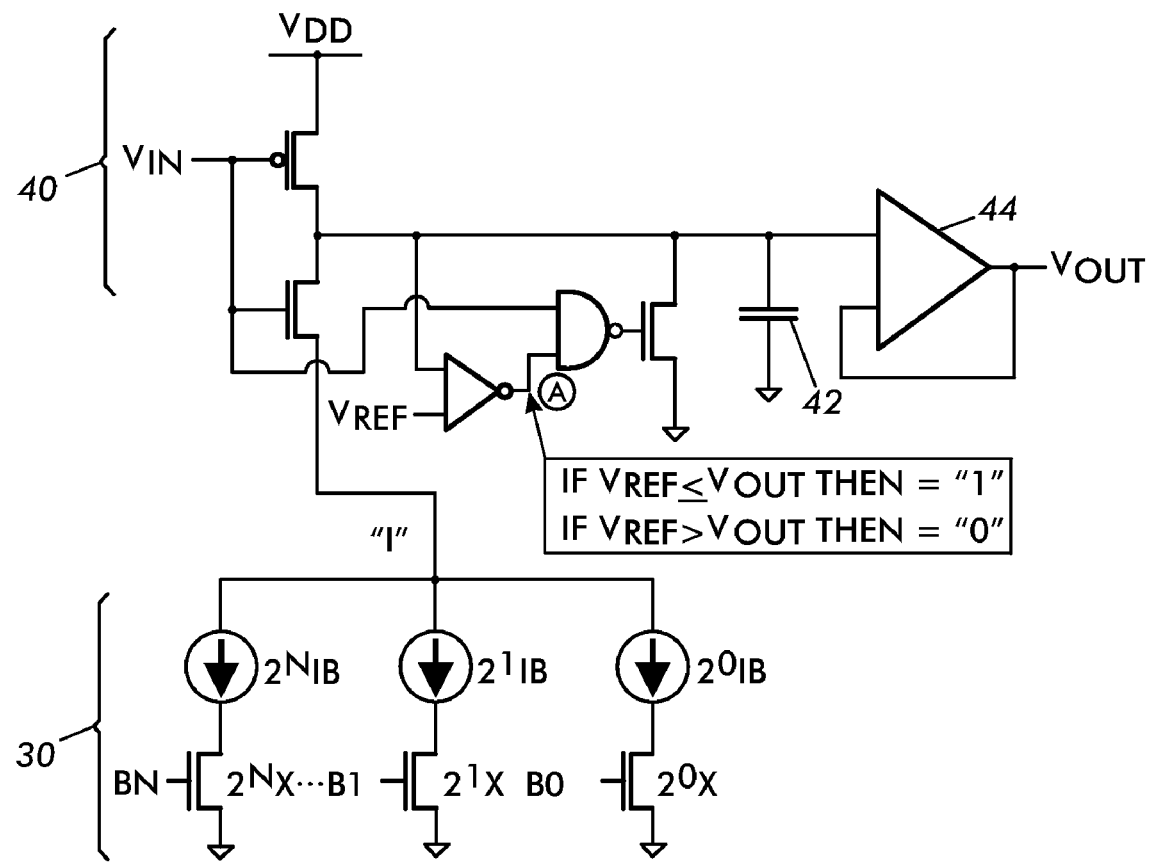
FIG. 3, is a schematic diagram of a second portion of the driver of FIG. 1.

Comparator 16 compares the values from counter 12 and register 14. The outputs of comparator 16 are directed to a binary up/down counter 18, which in turn outputs a parallel control $B_0 \ldots B_N$ to a binary-weighted current source 30, as shown in FIG. 3. If the counter value is larger than the register value (i.e., the duration is too long), the comparator 16 outputs an up signal to increment the control to the current source 30 by one. If the counter value is smaller than the register value (i.e., the duration is too short), the comparator 16 outputs a down signal to decrement the control to the current source 30 by one. If the counter and register values are equal the comparator 16 does nothing.

FIG. 3 is a schematic diagram of a second portion of the driver. This portion of the driver includes the binary-weighted current source, indicated as 30, which provides a predetermined level of current to a drive circuit, generally indicated as

40, that ultimately outputs the desired $V_{OUT}$ signal. (The "A" indicated in FIG. 3 is the same "A" control signal shown in FIGS. 1 and 2.) The current source 30 includes a plurality N of independent current sources, each responsive to one binary digit of the output from counter 18, so that the binary number from counter 18 acts as a "request" for a given current level to drive circuit 40. Increasing the counter 18 increases the value of the current source 30 and, conversely, decreasing the counter 18 decreases the value of the current source 30.

Certain aspects of drive circuit 40, such as $V_{DD}$, are discussed in the Published Patent Application incorporated by reference, but of note in the present embodiment are the discrete integrated capacitor 42, and unity-gain buffer 44. The discrete capacitor 42 replaces the distributed parasitic capacitance associated with the load of $V_{OUT}$ in the calculation of $\Delta T$. The advantage is that the tolerance of a discrete integrated capacitor in a typical mixed signal CMOS process is only ±10%. The unity-gain buffer 44 isolates the output capacitance of the driver from capacitor 42, thus reducing the variation of $\Delta T$.

With the driver as described, the variation of $\Delta T$ of is significantly reduced compared with prior art. With the present driver, $\Delta T$ is no longer dependent on the absolute value of I and C but is now limited by the resolution of the current source control (i.e., the width N in bits of the counter 18, feeding into current source 30). For example, if N=4, the variation of $\Delta T$ is ±14%. Increasing the resolution to N=8 reduces the variation to ±0.8%. In general the variation of $\Delta T$ is now $\pm 2/(2^N-1)$ if the adjustable range of the current source is adequate to compensate for the absolute variation of "I" and "C".

In the context of a photosensor chip, the driver only makes one counter adjustment for each line-time of image output; therefore, the output of several lines of data will be required to reach a steady state. This is typically not a problem because hundreds of lines of image data are output during the warm-up of a larger system.

Depending on the operating conditions, operation of the driver could result in an oscillation between two different values in the $\Delta T$ counter 12. This is not likely to be an issue because with an eight-bit granularity in the current selection, a one bit change in the value of the current would change a nominal $\Delta T$ of 5 μs less than 80 ns. However, if an artifact shows up, the embodiment could be modified. For example, by applying the appropriate logic to the normal slew rate trigger and a slightly delayed version to the $\Delta T$ register, enough hysteresis can be put into the circuit to prevent oscillation between two binary current source values. Two embodiments are shown that can be used to stabilize $\Delta T$.

Figure 4:
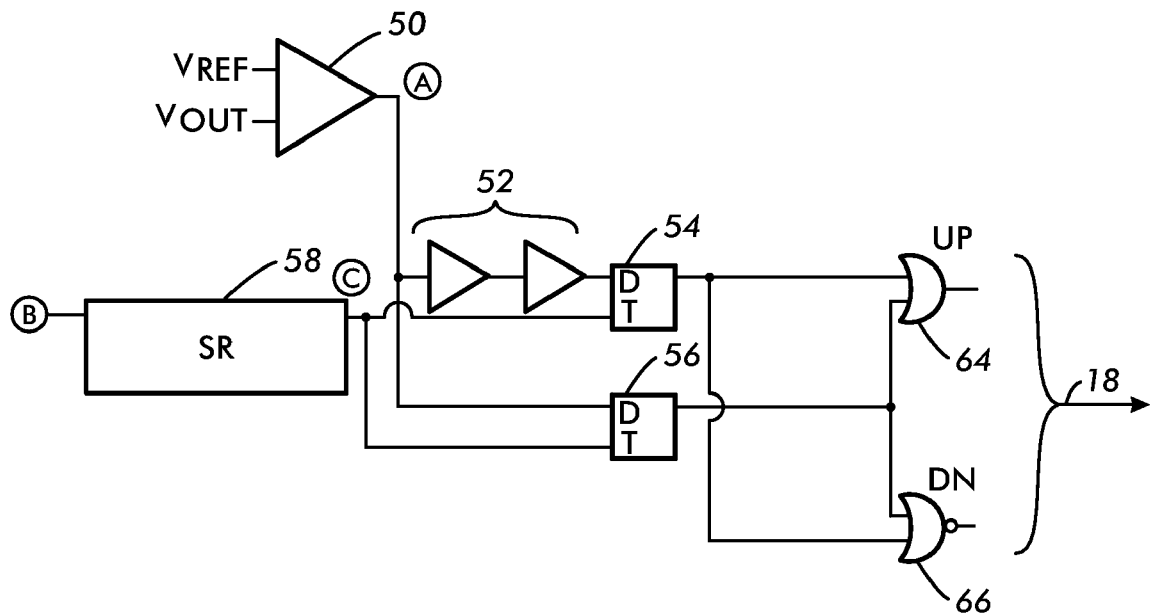
FIGS. 4 and 5 are respective schematic diagrams of alternative embodiments of a portion of a driver.
Figure 5:
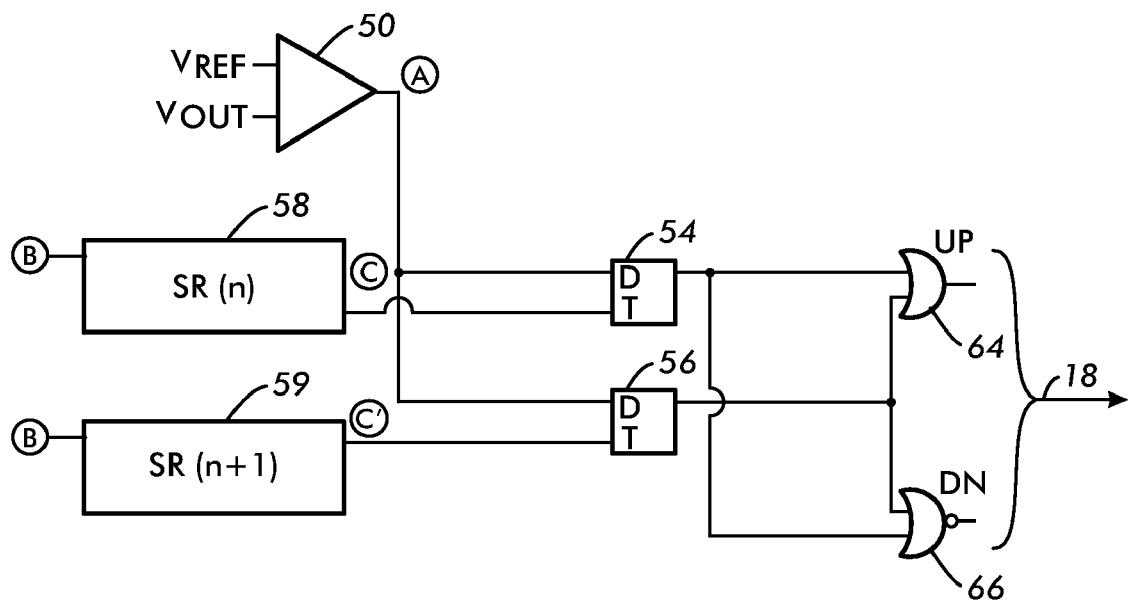

FIGS. 4 and 5 are respective schematic diagrams of alternative embodiments of the FIG. 1 portion of the driver, each of which addresses directly the oscillation problem; for present purposes, each of the embodiments can be considered an "anti-oscillation circuit." In either case, the inputs are $V_{IN}$, $V_{OUT}$ (feedback) and $V_{REF}$, with a predetermined number of fence clock pulses programmed consistent with a desired slew rate of $V_{OUT}$. The outputs are "up" and "down" signals that can be applied to a parallel binary signal reflective of applied current to obtain desired $V_{OUT}$, such as applied to up-down counter 18 in the FIG. 1 embodiment. Also, the lettered inputs such as A, B, and C in each Figure correspond to equivalent letters in the circuit diagram of FIG. 1 and the timing diagram of FIG. 2.

In the FIG. 4 embodiment, $V_{REF}$ and $V_{OUT}$ are applied to AND gate 50, which functions as a comparator between $V_{REF}$ and $V_{OUT}$. The output of AND gate 50 is applied to data latches 54 and 56, but the application to data latch 54 is buffered through two inverters 52. Also applied to each data latch 54, 56 is a pulse C that is delayed by a predetermined number of fence clock counts via shift register delay buffer 58; the number of counts associated with the delay is programmed into buffer 58, and is consistent with desired slew rate for $V_{OUT}$, in a manner analogous to the count described in register 14 with FIG. 1 above. The outputs of the data latches are then applied to respective NOR gates 64, 66, which thus form the "up" and "down" signals applicable to counter 18 as described above with regard to FIG. 1.

In the FIG. 5 embodiment, $V_{REF}$ and $V_{OUT}$ are applied to AND gate 50, which functions as a comparator between $V_{REF}$ and $V_{OUT}$. The output of AND gate 50 is applied to data latches 54 and 56. The other input to data latch 54 is a signal C delayed by n fence clock counts, once again consistent with a desired slew rate for $V_{OUT}$; the other input to latch 56 is a signal C' delayed by n+1 fence clock counts. As mentioned above, the oscillating or "flickering" situation tends to occur when a mandated number of counts for a desired slew rate of $V_{OUT}$ is between two integer fence-clock counts, i.e., between n and n+1. The outputs of the data latches are then applied to respective NOR gates 64, 66, which form the "up" and "down" signals applicable to counter 18 as described above with regard to FIG. 1.

In either of the FIG. 4 or FIG. 5 embodiments, the programmable shift register delay blocks 58 or 59 are programmed to cause the desired slew delay; the inputs to blocks 58, 59 are the signal B as shown in FIG. 2. The edge triggered data latches 54, 56 capture the output of the $V_{REF}-V_{OUT}$ comparator. This captured state is used to increment or decrement the binary outputs to the current source 30 shown in FIG. 3. The logic embodied by the elements in FIG. 4 or 5 is such that if the slew falls within some small window the digital control of current source 30 (which acts as a digital-analog converter) is not incremented or decremented. This prevents oscillation in the input to current source 30. The small window, where the current source will be controlled to maintain a steady state, corresponds to the delay caused by the buffers 52 in FIG. 4 and difference n, n+1 in the shift register counters in FIG. 5. The requirements for the delay differences in FIGS. 4 and 5 are necessary to ensure that the final least-significant-bit change in the current source 30 moves the delay to a region where jitter will not result in a future decrement or increment of the input to the current source.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. An apparatus for controlling a slew rate of a signal, comprising:
    a counter for measuring a duration that the signal drops from a maximum voltage to a predetermined reference voltage;
    a register for retaining data relating to a desired duration that the signal drops from the maximum voltage to the predetermined reference voltage; and
    a comparator for comparing the measured duration to the desired duration, the comparator being operative of a current source for the signal.

2. The apparatus of claim 1, further comprising
    a binary-weighted current source, responsive to the comparator.

3. The apparatus of claim 2, further comprising
a drive circuit, responsive to the current source, for outputting the signal.

4. The apparatus of claim 3, the drive circuit including a discrete integrated capacitor and a unity-gain buffer.

5. The apparatus of claim 1, the counter counting a discrete number of fence clocks to measure the duration.

6. The apparatus of claim 5, the register retaining the desired duration as a count of a discrete number of fence clocks.

7. The apparatus of claim 5, further comprising
an anti-oscillation circuit for preventing the counter oscillating between two counts of fence clocks.

8. The apparatus of claim 7, the anti-oscillation circuit including
an AND gate combining the signal with the predetermined reference voltage; and
a buffer for buffering an output of the AND gate.

9. The apparatus of claim 7, the anti-oscillation circuit including
a first shift register delay block, for delaying a shift-register signal operative of the drive circuit by a count associated with the desired duration.

10. The apparatus of claim 9, the anti-oscillation circuit further including
a second shift register delay block, for delaying a shift-register signal operative of the drive circuit by a count associated with the desired duration, plus one count.

* * * * *